(12) United States Patent
Shi et al.

(10) Patent No.: US 8,759,880 B2
(45) Date of Patent: Jun. 24, 2014

(54) ULTRA-HIGH VOLTAGE SIGE HBT DEVICE AND MANUFACTURING METHOD OF THE SAME

(71) Applicant: Shanghai Hua Hong NEC Electronics Co., Ltd, Shanghai (CN)

(72) Inventors: Jing Shi, Shanghai (CN); Donghua Liu, Shanghai (CN); Jun Hu, Shanghai (CN); Wensheng Qian, Shanghai (CN); Wenting Duan, Shanghai (CN); Fan Chen, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/911,375

(22) Filed: Jun. 6, 2013

(65) Prior Publication Data
US 2013/0328108 A1  Dec. 12, 2013

(30) Foreign Application Priority Data
Jun. 8, 2012 (CN) .......................... 2012 1 0187217

(51) Int. Cl.
*H01L 29/737* (2006.01)
*H01L 29/38* (2006.01)
*H01L 29/417* (2006.01)

(52) U.S. Cl.
USPC ............................. 257/197; 438/318; 438/328

(58) Field of Classification Search
None
See application file for complete search history.

(56) References Cited

U.S. PATENT DOCUMENTS

| | | | |
|---|---|---|---|
| 8,227,832 B2 * | 7/2012 | Chiu et al. | 257/156 |
| 8,378,457 B2 * | 2/2013 | Chen et al. | 257/587 |
| 8,395,188 B2 * | 3/2013 | Liu et al. | 257/197 |
| 8,420,475 B2 * | 4/2013 | Chiu et al. | 438/202 |
| 8,421,185 B2 * | 4/2013 | Chiu et al. | 257/526 |
| 8,455,975 B2 * | 6/2013 | Liu et al. | 257/517 |
| 2013/0140604 A1 * | 6/2013 | Hu et al. | 257/191 |

* cited by examiner

*Primary Examiner* — Thomas L Dickey
*Assistant Examiner* — Joseph Schoenholtz
(74) *Attorney, Agent, or Firm* — MKG, LLC

(57) ABSTRACT

An ultra-high voltage silicon-germanium (SiGe) heterojunction bipolar transistor (HBT), which includes: a P-type substrate; an N-type matching layer, a P-type matching layer and an N− collector region stacked on the P-type substrate from bottom up; two field oxide regions separately formed in the N− collector region; N+ pseudo buried layers, each under a corresponding one of the field oxide regions and in contact with each of the N-type matching layer, the P-type matching layer and the N− collector region; an N+ collector region between the two field oxide regions and through the N− collector region and the P-type matching layer and extending into the N-type matching layer; and deep hole electrodes, each in a corresponding one of the field oxide regions and in contact with a corresponding one of the N+ pseudo buried layers. A method of fabricating an ultra-high voltage SiGe HBT is also disclosed.

13 Claims, 5 Drawing Sheets

US 8,759,880 B2

ULTRA-HIGH VOLTAGE SIGE HBT DEVICE AND MANUFACTURING METHOD OF THE SAME

CROSS-REFERENCES TO RELATED APPLICATIONS

This application claims the priority of Chinese patent application number 201210187217.9, filed on Jun. 8, 2012, the entire contents of which are incorporated herein by reference.

TECHNICAL FIELD

The present invention relates to integrated semiconductor circuits, and more particularly, to an ultra-high voltage silicon-germanium (SiGe) heterojunction bipolar transistor (HBT) device and a method of fabricating the same.

BACKGROUND

With the development of modern mobile communication and microwave communication as well as demands for high-performance, low-noise and low-cost radio frequency (RF) components, traditional silicon devices can no longer meet new requirements on technical specifications, output power and linearity. Therefore, SiGe HBT devices have been proposed which play an important role in the applications of high-frequency power amplifiers. Compared with gallium arsenide (GaAs) devices, though SiGe HBT devices are at a disadvantage in frequency performance, they can well solve the issue of heat dissipation accompanying with power amplification, benefiting from their better thermal conductivities and good mechanical capacities of their substrates. Moreover, SiGe HBT devices also have better linearity and higher integration level. Further, SiGe HBT devices are compatible with the conventional silicon process and still belong to the silicon-based technology and the complementary metal oxide semiconductor (CMOS) process, thus reducing manufacturing cost. For these reasons, the SiGe BiCMOS (bipolar complementary metal oxide semiconductor) process provides great convenience for the integration of power amplifiers and logic control circuits.

Currently, silicon-germanium (SiGe) heterojunction bipolar transistors (HBTs) have been widely adopted internationally as high-frequency, high-power amplifier devices for wireless communication products such as power amplifiers and low-noise amplifiers used in mobile phones. In order to improve the output power of an RF power amplifier, it is an effective method to increase its operating current or operating voltage within the normal ranges. Those SiGe HBTs having high breakdown voltages are popularly used because they consume less electric power by allowing a circuit to operate under a smaller current with the same power consumption. Therefore, further increasing the breakdown voltage of a SiGe HBT without deteriorating its characteristic frequency is more and more focused in the research of SiGe HBTs.

SUMMARY OF THE INVENTION

The present invention is directed to the provision of an ultra-high voltage silicon-germanium (SiGe) heterojunction bipolar transistor (HBT) device with an increased breakdown voltage and a method of fabricating the same.

In order to achieve the above objectives, the present invention provides an ultra-high voltage SiGe HBT, which includes: a P-type substrate with a low dopant concentration; an N-type matching layer, a P-type matching layer and an N− collector region formed on the P-type substrate from the bottom up; two separate field oxide regions in the N− collector region; N+ pseudo buried layers, each under a corresponding one of the field oxide regions and in contact with each of the N-type matching layer, the P-type matching layer and the N− collector region; an N+ collector region between the two field oxide regions, the N+ collector region being formed through the N− collector region and the P-type matching layer and extending into the N-type matching layer; and deep hole electrodes, each in a corresponding one of the field oxide regions and in contact with a corresponding one of the N+ pseudo buried layers.

The method of manufacturing the ultra-high voltage SiGe HBT includes: 1) sequentially growing, by epitaxy, an N-type matching layer and a P-type matching layer over a P-type substrate having a low dopant concentration; 2) depositing an epitaxial layer having a moderate to low dopant concentration over the P-type matching layer, the epitaxial layer serving as an N− collector region; 3) forming two separate shallow trenches in the N− collector region and forming field oxide regions by filling silicon oxide in the shallow trenches; 4) forming N+ pseudo buried layers by implanting ions into the N-type and P-type matching layers; 5) forming an N+ collector region between the field oxide regions, the N+ collector region being formed through the N− collector region and the P-type matching layer and extending into the N-type matching layer; 6) forming a SiGe base region above both the field oxide regions and the N+ collector region; 7) forming an emitter above the SiGe base region; and 8) forming a deep hole electrode in each of the field oxide regions by etching each of the field oxide regions to form a deep hole therein which exposes an underlying corresponding one of the N+ pseudo buried layers and depositing a transition metal layer and filling tungsten in the deep hole.

Compared to conventional devices which employ a uniformly doped N-type buried layer (NBL) that has to be picked up by a contact hole formed in the active region, in the ultra-high voltage SiGe HBT of the present invention, heavily doped N-type pseudo buried layers are formed under respective field oxide regions on corresponding sides of the active region, and the collector region can be directly picked up via the pseudo buried layers that are connected to respective deep hole electrodes formed in the corresponding field oxide regions. Such design allows the active region not to be involved in picking up the buried layers and hence results in great reduction of device size and area. Moreover, by lightly doping the collector region formed between the pseudo buried layers, an ultra-high breakdown voltage of the collector-base (BC) junction can be achieved, and thus the breakdown voltage BVCEO of the whole device is improved.

Furthermore, different from the BC junction of a conventional HBT which is a one-dimensional depletion region, the BC junction of the ultra-high voltage SiGe HBT of this invention has a two-dimensional depletion structure, in which there is not only a certain depth of depletion towards the substrate but also lateral depletion from the center of the device to both the pseudo buried layers on the two opposing sides. Moreover, the addition of a matching layer results in that a lightly doped region located under the field oxide regions will be completely depleted before the breakdown of the BC junction. This can help withstand part of the voltage applied to the device and thus result in an ultra-high breakdown voltage of the device.

BRIEF DESCRIPTION OF THE DRAWINGS

To further describe the present invention, reference is made to the following detailed description on example embodiments, taken in conjunction with the accompanying drawings, in which.

DETAILED DESCRIPTION

In one embodiment, an ultra-high voltage SiGe HBT (the so-call "ultra-high voltage" herein refers to a breakdown voltage of 7 V to 10 V with respect to that of a regular transistor which is typically of 2 V to 4 V) embodying the present invention is manufactured by a method including the following steps.

Figure 3:
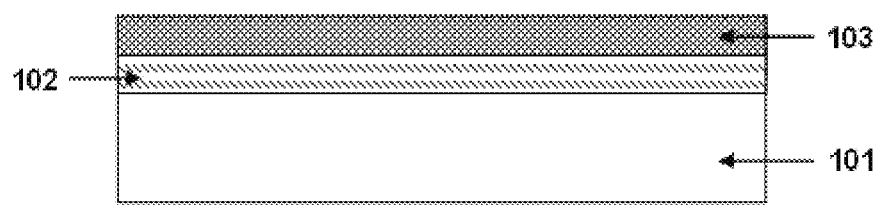
FIG. 3 depicts a cross-sectional view of a structure after a P-type matching layer has been formed.

In a first step, as shown in FIG. 3, an N-type matching layer 102 and a P-type matching layer 103 are sequentially grown by epitaxy over a P-type substrate 101 with a low dopant concentration (which means a bulk concentration is smaller than $1\times10^{14}$ cm$^{-3}$). Dopant concentrations of the N-type and P-type matching layers 102, 103 may be determined by a dopant concentration of a collector region formed in a subsequent step discussed below.

Figure 4:
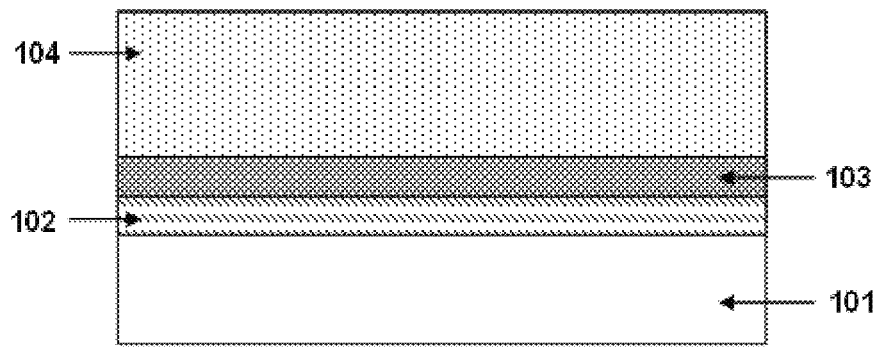
FIG. 4 depicts a cross-sectional view of a structure after an N− collector region has been formed by depositing an epitaxial layer.

In a second step, as shown in FIG. 4, an epitaxial layer with a certain thickness and having a moderate to low dopant concentration (which means a bulk concentration of $1\times10^{15}$ cm$^{-3}$ to $5\times10^{16}$ cm$^{-3}$) is formed over the P-type matching layer 103. The epitaxial layer serves as an N− collector region 104. The N− collector region 104 may have the same dopant concentration with the N-type matching layer 102. The N− collector region may be doped with arsenic ions or phosphorus ions to result in a high breakdown voltage of a BC junction formed between a base and a collector of the device.

Figure 5:
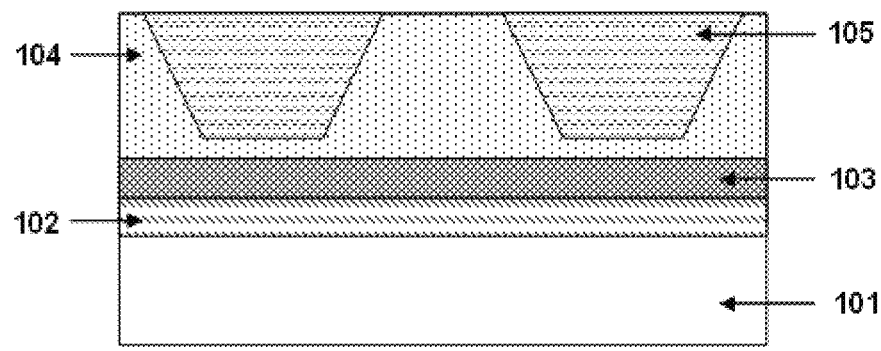
FIG. 5 depicts a cross-sectional view of a structure after field oxide regions have been formed.

In a third step, referring to FIG. 5, two separate shallow trenches (each having a depth of 2000 Å to 4000 Å) are formed in the N− collector region 104 by etch. Next, the trenches are filled with silicon oxide, followed by a chemical-mechanical planarization (CMP) process, to form field oxide regions 105. In this embodiment, shallow trench isolation (STI) rather than deep trench isolation (DTI) is used.

Figure 6:
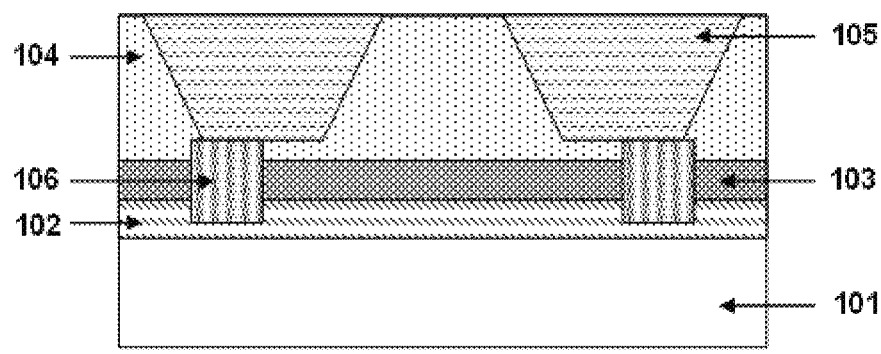
FIG. 6 depicts a cross-sectional view of a structure after N+ pseudo buried layers have been formed.

In a fourth step, two first ion implantation windows (not shown) are formed above the N− collector region 104 by photolithography. Next, as shown in FIG. 6, N+ pseudo buried layers 106 are formed by implanting ions into the N-type and P-type matching layers 102, 103 through the first ion implantation windows, with regions other than the first ion implantation windows protected by a photoresist. Each of the N+ pseudo buried layers 106 is located at the bottom of a corresponding field oxide region 105 and passes through a portion of the N− collector region 104, the entire depth of the P-type matching layer 103 and at least a part of the depth of the N-type matching layer 102. The N+ pseudo buried layers may be doped with arsenic ions or phosphorus ions with a high dose of $1e^{14}$ cm$^{-2}$ to $1e^{16}$ cm$^{-2}$ and a low energy of 2 KeV to 50 KeV. In this embodiment, the N+ pseudo buried layers 106, which are doped with a lower energy and thus form a smaller junction area and hence a smaller parasitic capacitance with the P-type substrate 101, are formed to substitute the conventional collector buried layers.

Figure 7:
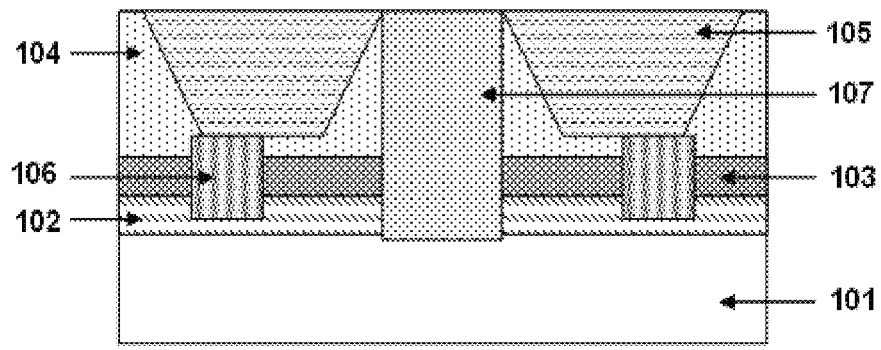
FIG. 7 depicts a cross-sectional view of a structure after an N+ collector region has been formed.

In a fifth step, referring to FIG. 7, a second ion implantation window is defined and formed above the N− collector region 104 and between the field oxide regions 105 by photolithography. Next, a vertical N+ collector region 107 is formed by performing ion implantation in the second ion implantation window. The N+ collector region 107 may be heavily doped at a high dose (e.g., at a dose of $1\times10^{15}$ cm$^{-2}$ to $5\times10^{16}$ cm$^{-2}$) with arsenic ions or phosphorus ions to reduce the BETA (current gain) of a parasitic PNP transistor.

Figure 8:
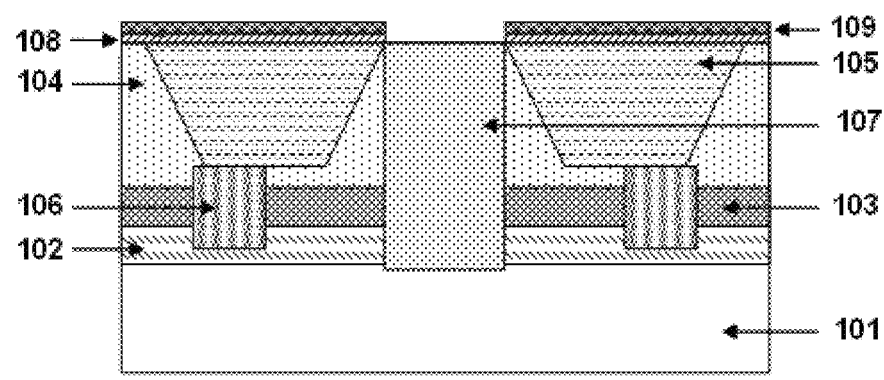
FIG. 8 depicts a cross-sectional view of a structure after a base window has been formed.

In a sixth step, as shown in FIG. 8, a silicon oxide layer 108 having a thickness of 100 Å to 500 Å is first deposited over the resulting structure after the fifth step. Next, a polysilicon layer 109 having a thickness of 200 Å to 1500 Å is further deposited over the silicon oxide layer 108. After that, a base window is formed in the silicon oxide layer 108 and the polysilicon layer 109 by photolithography and etching.

Figure 9:
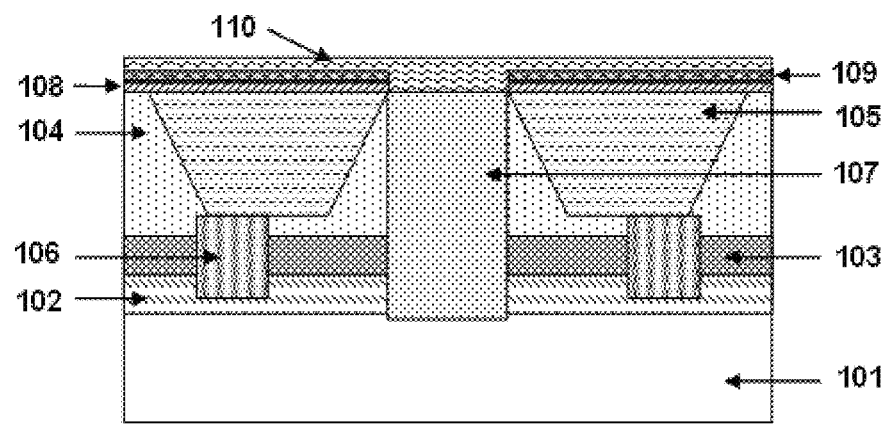
FIG. 9 depicts a cross-sectional view of a structure after a SiGe base epitaxial layer has been grown.

In a seventh step, referring to FIG. 9, a silicon transition layer (not shown), a SiGe base epitaxial layer 110 and a first silicide layer (not shown) are sequentially grown, covering the polysilicon layer 109 and filling the base window. Thicknesses of these layers may be determined by characteristics of the device being manufactured. The SiGe base epitaxial layer 110 may be heavily doped with boron (e.g., the bulk boron concentration thereof is $1\times10^{18}$ cm$^{-3}$ to $5\times10^{20}$ cm$^{-3}$). The SiGe base epitaxial layer 110 may have a trapezoid or triangular germanium distribution and a germanium concentration determined by characteristics of the device being manufactured. Forming the silicide layer over the SiGe base epitaxial layer 110 can reduce the parasitic resistance.

Figure 10:
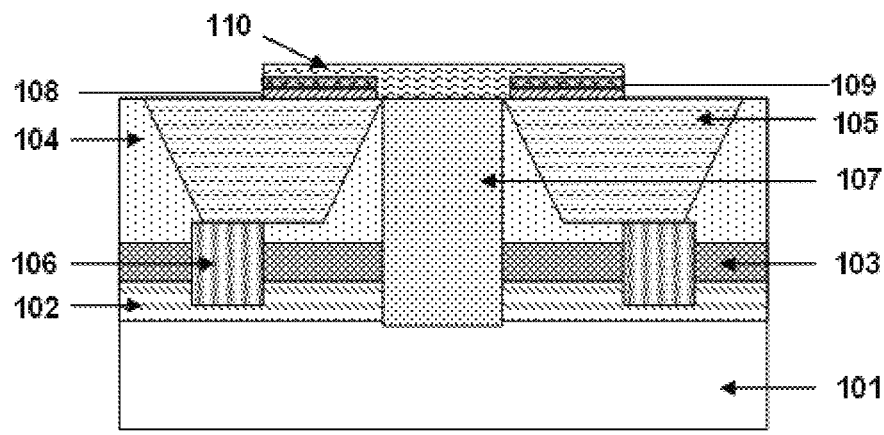
FIG. 10 depicts a cross-sectional view of a structure after a SiGe base region has been formed.

In an eighth step, as shown in FIG. 10, a SiGe base region is formed by removing portions of each of the SiGe base epitaxial layer 110, the polysilicon layer 109 and the silicon oxide layer 108 by photolithography and etching.

Figure 11:
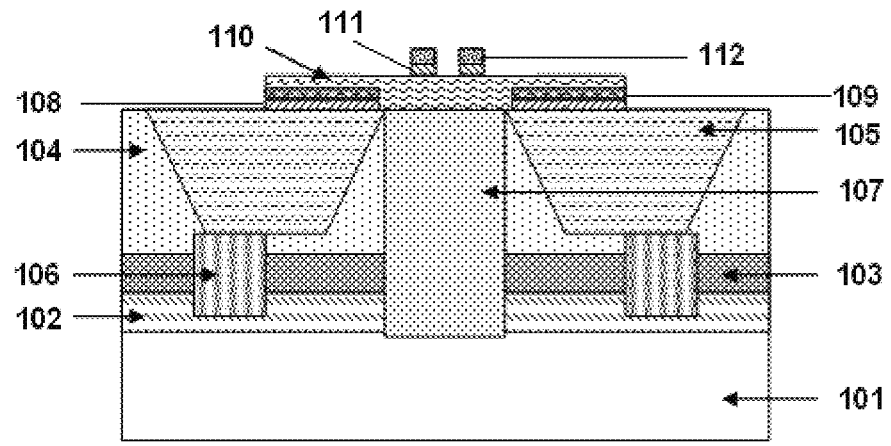
FIG. 11 depicts a cross-sectional view of a structure after an emitter window has been formed.

In a ninth step, referring to FIG. 11, a silicon oxide dielectric layer 111 and a silicon nitride dielectric layer 112 are deposited successively over the SiGe base region. After that, an emitter window is formed in these layers by photolithography and etching.

Figure 12:
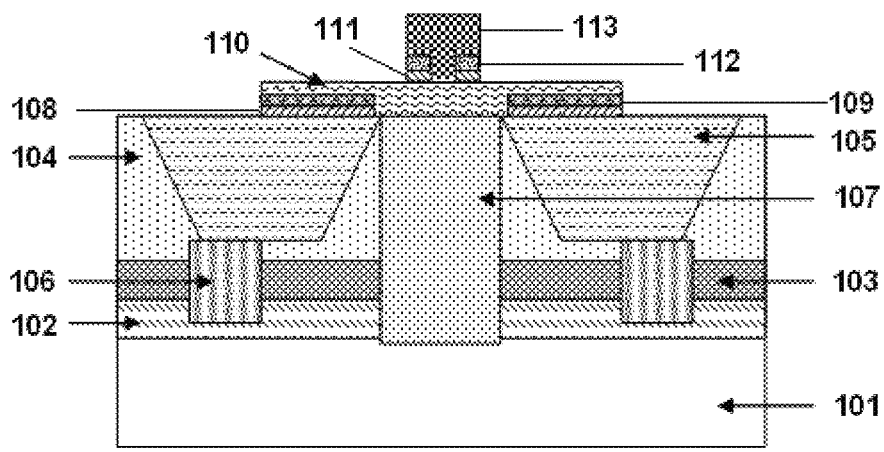
FIG. 12 depicts a cross-sectional view of a structure after an emitter has been formed.

In a tenth step, as shown in FIG. 12, an in-situ doped N-type polysilicon-emitter layer 113 is deposited, covering the silicon nitride dielectric layer 112 and filling the emitter window.

Next, an N-type dopant, which may be arsenic or phosphorus, is implanted into the polysilicon-emitter layer 113 with a concentration higher than $1e^{15} cm^{-2}$ and an energy determined by a thickness of the emitter being formed, followed by an annealing process for activating and facilitating diffusion of the N-type dopant in the polysilicon-emitter layer 113. After that, an emitter is formed by removing portions of each of the polysilicon-emitter layer 113, the silicon nitride dielectric layer 112 and the silicon oxide dielectric layer 111 by photolithography and etching.

Next, a second silicide layer (not shown) for parasitic resistance reduction may be formed over the polysilicon-emitter layer 113.

Figure 13:
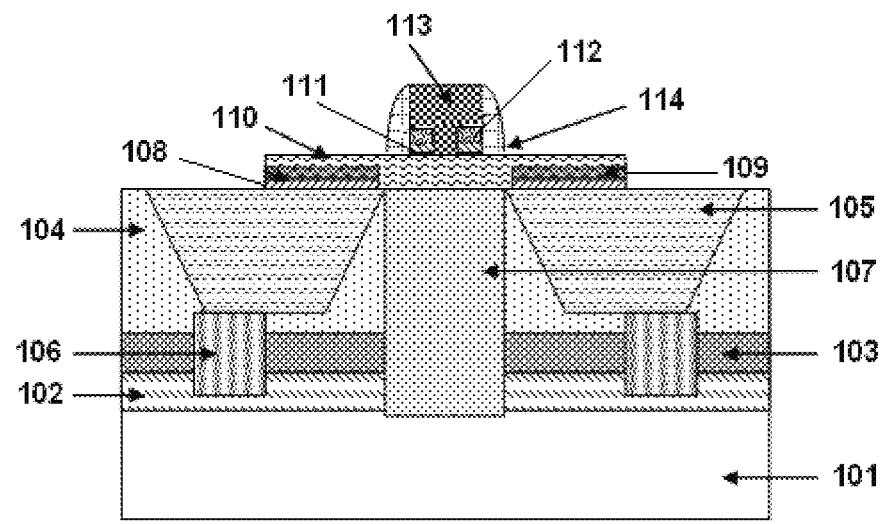
FIG. 13 depicts a cross-sectional view of a structure after emitter sidewalls have been formed.

In an eleventh step, referring to FIG. 13, emitter sidewalls 114 covering both sides of the emitter are formed by depositing a silicon oxide layer and thereafter dry etching the silicon oxide layer. Forming the emitter sidewalls 114 with silicon oxide can prevent short-circuit between the emitter and silicon oxide on the SiGe base region.

Figure 14:
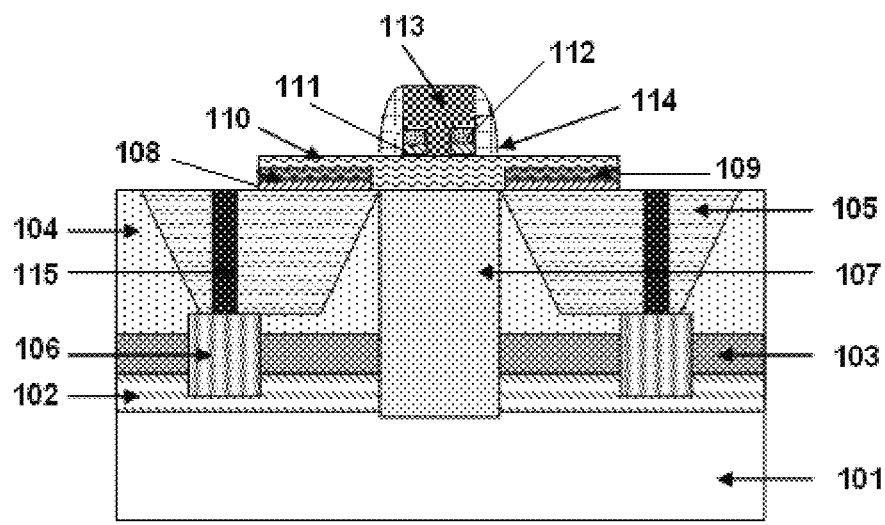
FIG. 14 depicts a cross-sectional view of a structure after the pseudo buried layers have been picked up via respective deep hole electrodes.

In a twelfth step, as shown in FIG. 14, deep holes 115 are formed in corresponding field oxide regions 105 by etching. Next, a transition metal layer comprising a titanium (Ti) layer and a titanium nitride (TiN) layer is deposited and tungsten (W) is filled in the deep holes 115, following by CMP, thereby picking up the pseudo buried layers 106 and hence picking up the collector of the device.

The Ti and TiN layers of the transition metal layer may be deposited by physical vapor deposition (PVD) or chemical vapor deposition (CVD). The Ti layer may have a thickness of 100 Å to 500 Å. The TiN layer may have a thickness of 50 Å to 500 Å. Depths of the deep holes 115 may be determined by the depths of the corresponding field oxide regions 105.

In this embodiment, instead of forming collector picked-up terminals by the implantation of N-type ions with a high concentration and a high energy, collector picked-up relies on the Ti and TiN layers and tungsten in the deep holes 115 formed in the field oxide regions 105, which are in contact with the pseudo buried layers 106. As the deep holes 115 are close to the SiGe base region, a too high collector resistance is avoided and collector parasitic capacitance is reduced.

Figure 1:
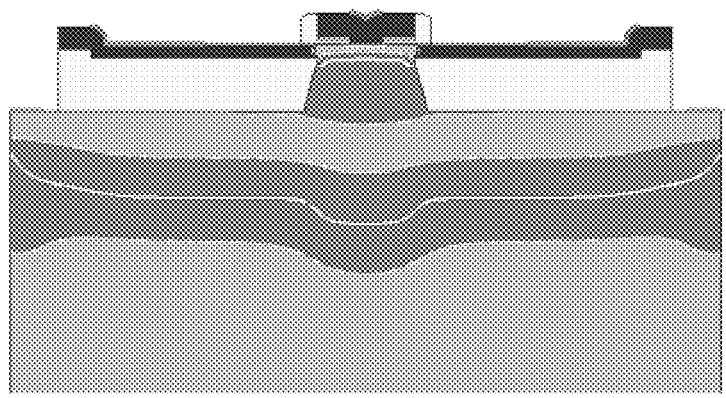
FIG. 1 is a diagram schematically illustrating a depletion region distribution of an ultra-high voltage SiGe HBT constructed in accordance with one embodiment of the present invention under a low reverse biased voltage.
Figure 2:
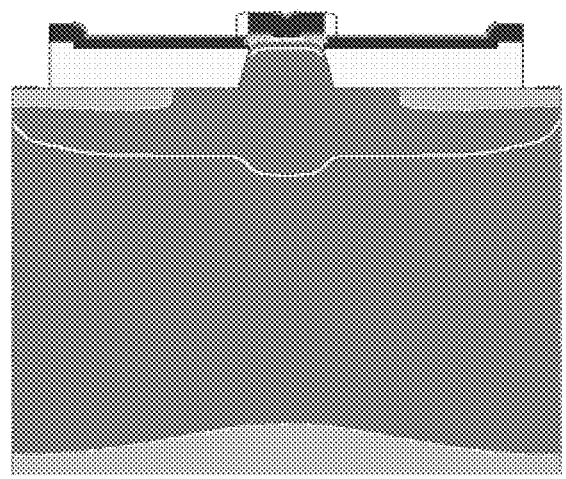
FIG. 2 schematically illustrates another depletion region distribution of the ultra-high voltage SiGe HBT of FIG. 1 under a high reverse biased voltage.

Moreover, the present invention greatly increases the breakdown voltage of the device by introducing pseudo buried layers and a matching layer instead of altering the thickness or doping concentration of the collector region. With such additions, the breakdown of the device is not determined by a single depletion region of the vertical base-collector (BC) junction anymore. A lateral depletion region will also be formed which can help to withstand part of the voltage applied to the device. Referring to FIG. 1, when a low reverse biased voltage is applied, depletion regions are formed around the BC junction and the matching layer. As shown in FIG. 2, when this reverse biased voltage is increased to a certain value, a depletion region is laterally broken into two parts before the BC junction is broken down. Since most of the reverse biased voltage is withstood by the lateral depletion region, such a depletion mechanism may result in a breakdown voltage of the device far greater than that of the BC junction. Thus, it could be found that the present invention is able to increase the breakdown voltage BVCEO of the device without altering the depth or doping concentration of its collector region. Furthermore, the present invention can address the too large device area issue of conventional devices caused by using an N-sinker (i.e., an N-type buried layer) to pick up the collector and can obtain a collector region with a lower parasitic resistance, by picking up the collector via deep hole electrodes formed in the field oxide regions and connected to the corresponding pseudo buried layers.

It should be understood that the specific embodiments described and illustrated above are not intended to limit the invention in any way. Those skilled in the art can make various modifications and variations without departing from the scope of the invention. Accordingly, it is intended that the present invention embrace all such modifications and variations.

What is claimed is:

1. An ultra-high voltage silicon-germanium (SiGe) heterojunction bipolar transistor (HBT), comprising:
   a P-type substrate with a low dopant concentration;
   an N-type matching layer, a P-type matching layer and an N– collector region formed on the P-type substrate from the bottom up;
   two separate field oxide regions in the N– collector region;
   N+ pseudo buried layers, each under a corresponding one of the field oxide regions and in contact with each of the N-type matching layer, the P-type matching layer and the N– collector region;
   an N+ collector region between the two field oxide regions, the N+ collector region being formed through the N– collector region and the P-type matching layer and extending into the N-type matching layer; and
   deep hole electrodes, each in a corresponding one of the field oxide regions and in contact with a corresponding one of the N+ pseudo buried layers.

2. The ultra-high voltage SiGe HBT according to claim 1, wherein dopant concentrations of the N-type and P-type matching layers are determined by a dopant concentration of the N+ collector region.

3. The ultra-high voltage SiGe HBT according to claim 1, wherein the N– collector region has a same dopant concentration with the N-type matching layer, and wherein the N– collector region is doped with arsenic ions or phosphorus ions.

4. The ultra-high voltage SiGe HBT according to claim 1, wherein the N+ pseudo buried layers are doped with arsenic ions or phosphorus ions with a high dose of $1e^{14} cm^{-2}$ to $1e^{16} cm^{-2}$ and a low energy of 2 KeV to 50 KeV.

5. The ultra-high voltage SiGe HBT according to claim 1, wherein the N+ collector region is heavily doped with arsenic ions or phosphorus ions with a high dose.

6. The ultra-high voltage SiGe HBT according to claim 1, wherein each of the deep hole electrodes includes a transition metal layer and a tungsten, and wherein the transition metal layer includes a titanium layer and a titanium nitride layer.

7. The ultra-high voltage SiGe HBT according to claim 1, further comprising:
   a SiGe base region above both the field oxide regions and the N+ collector region; and
   an emitter above the SiGe base region.

8. A method of manufacturing ultra-high voltage silicon-germanium (SiGe) heterojunction bipolar transistor (HBT), comprising the steps of:
   1) sequentially growing, by epitaxy, an N-type matching layer and a P-type matching layer over a P-type substrate having a low dopant concentration;
   2) depositing an epitaxial layer having a moderate to low dopant concentration over the P-type matching layer, the epitaxial layer serving as an N– collector region;
   3) forming two separate shallow trenches in the N– collector region and forming field oxide regions by filling silicon oxide in the shallow trenches;
   4) forming N+ pseudo buried layers by implanting ions into the N-type and P-type matching layers;
   5) forming an N+ collector region between the field oxide regions, the N+ collector region being formed through the N− collector region and the P-type matching layer and extending into the N-type matching layer;
6) forming a SiGe base region above both the field oxide regions and the N+ collector region;
7) forming an emitter above the SiGe base region; and
8) forming a deep hole electrode in each of the field oxide regions by etching each of the field oxide regions to form a deep hole therein which exposes an underlying corresponding one of the N+ pseudo buried layers and depositing a transition metal layer and filling tungsten in the deep hole.

9. The method according to claim 8, wherein dopant concentrations of the N-type and P-type matching layers formed in the step 1) are determined by a dopant concentration of the N+ collector region.

10. The method according to claim 8, wherein the N− collector region formed in the step 2) has a same dopant concentration with the N-type matching layer, and wherein the N-collector region is doped with arsenic ions or phosphorus ions.

11. The method according to claim 8, wherein the N+ pseudo buried layers formed in the step 4) are doped with arsenic ions or phosphorus ions with a high dose of $1e^{14}$ cm$^{-2}$ to $1e^{16}$ cm$^{-2}$ and a low energy of 2 KeV to 50 KeV.

12. The method according to claim 8, wherein the N+ collector region formed in the step 5) is heavily doped with arsenic ions or phosphorus ions with a high dose.

13. The method according to claim 8, wherein in the step 8), the transition metal layer is deposited by PVD or CVD.

\* \* \* \* \*